United States Patent [19]
Claisse et al.

[11] Patent Number: 5,917,848
[45] Date of Patent: Jun. 29, 1999

[54] VERTICAL CAVITY SURFACE EMITTING LASER WITH PHASE SHIFT MASK

[75] Inventors: Paul Claisse, Gilbert; Wenbin Jiang, Phoenix, both of Ariz.

[73] Assignee: Motorola, Inc., Schaumburg, Ill.

[21] Appl. No.: 08/895,780

[22] Filed: Jul. 17, 1997

[51] Int. Cl.⁶ .................................................. H01S 3/085
[52] U.S. Cl. ............................ 372/96; 372/45; 372/46; 372/50; 372/29; 372/92
[58] Field of Search ............................ 372/46, 92, 29, 372/45, 50, 96

[56] References Cited

U.S. PATENT DOCUMENTS

| | | | |
|---|---|---|---|
| 4,805,176 | 2/1989 | Botez et al. | 372/29 |
| 5,493,577 | 2/1996 | Choquette et al. | 372/46 |
| 5,732,101 | 3/1998 | Shin | 372/92 |

*Primary Examiner*—Rodney Bovernick
*Assistant Examiner*—Sung T. Kim
*Attorney, Agent, or Firm*—Eugene A. Parsons; William E. Koch

[57] ABSTRACT

A vertical cavity surface emitting laser (VCSEL) with an integrated phase shift mask for use in an optical pickup head for high density optical storage applications and a method of fabrication. The VCSEL is capable of emitting a power output of at least 10 mW. The phase shift mask is integrated with the VCSEL to allow for a 180° shift in light emitted therethrough, thereby creating a reduced focal spot size for high density data write applications. The VCSEL with integrated phase shift mask is utilized in an optical pickup head capable of high density read and write applications for both CDs and DVDs.

23 Claims, 2 Drawing Sheets

29

VERTICAL CAVITY SURFACE EMITTING LASER WITH PHASE SHIFT MASK

FIELD OF THE INVENTION

This invention relates to a vertical cavity surface emitting laser and more particularly to a vertical cavity surface emitting laser with an integrated phase mask for use in high density optical data storage applications.

BACKGROUND OF THE INVENTION

The rapid advancement of multimedia applications requires a system that stores more information more compactly, and is easier to use and handle. Digital video disc (DVD) technology offers this high density format advantage. DVD technology is based on a new generation of a compact disc format which provides for increased storage capacity and performance, especially for video and multimedia applications.

Compact disc (CD) technology has become the global standard for music, entertainment and computer software. Although extremely popular, CD technology has yet been able to provide high density formats. A compact disc (CD) can typically only store approximately five minutes worth of analog image information, and a larger size laser disc of 11.8 inches can store approximately sixty minutes of analog image information. Accordingly, the movie/entertainment and computer industries want to pursue high density formats, such as that found in DVD technology.

As the industry introduces this new digital technology, and other high density optical storage devices, an increasingly important consideration is the beam profile of the pickup head light source and the required focal spot size of the pickup head light source in achieving optimal performance. In general, a high density format disc, such as a DVD disc, has a pit length of 0.4 $\mu$m and a track pitch of 0.74 $\mu$m, almost half that of a CD format disc. During operation of these high density format discs, data reading applications require 3–4 mW of power, while data writing applications require a minimum of 10 mW to operate. Therefore, when utilizing a single mode optical light source, there is a requirement for operation at a higher power. Typically the focal spot size of a high power spatially multimode output light source is too large to allow for writing data to the high density data storage device. Accordingly, to utilize such high power multimode optical light sources in data writing applications, the focal spot size of the high power light output beam must be reduced in size.

Many light sources can potentially be utilized for these high density read and write applications, such as any type of coherent laser light source, as long as it operates in a donut, high order Hermite-Gaussian mode, or Whispering-Gallery mode. Light sources such as organic lasers, semiconductor lasers, gas lasers, solid state lasers, or higher mode lasers with at least two lobes that are capable of undergoing a phase shift, or other similar light sources can be utilized taking into account the necessary adjustments to reduce the focal spot size. In particular, there is a strong desire to utilize a donut mode vertical cavity surface emitting laser (VCSEL) and/or first order mode light source that has the required high power output, yet in doing so there remains the need to minimize the focal spot size for data writing applications to high density data storage discs.

It would be highly advantageous to remedy the foregoing high power versus focal spot size challenge and other deficiencies inherent in the prior art. Thus, it is highly desirable and an object of the present invention to provide for a light source, more particularly VCSEL capable of generating an optical focal spot size of reduced dimension so as to allow for optimal operation in a data write mode. Accordingly, proposed is a low cost VCSEL with an integrated phase shift mask to be used for high density optical data storage.

Another object of the invention is to provide for a VCSEL having a sufficient output power for data write applications.

It is yet another object of the present invention to provide for a VCSEL that generates a small focal spot size for the writing of information to and from, high density optical storage devices, such as CDs and DVDs.

Still another object of the present invention is to provide for a method of fabricating a VCSEL that allows for high power operation while maintaining reduced focal spot size for use in both optical read and write applications.

Yet another object of the invention is to reduce the complexity, thus cost, of a light source used in a high density optical storage pickup head.

SUMMARY OF THE INVENTION

Briefly, to achieve the desired objects of the instant invention in accordance with a preferred embodiment thereof, provided is a vertical cavity surface emitting laser (VCSEL) including a substrate element, a first DBR mirror stack, an active region, a second DBR mirror stack and an integrated phase shift mask. The VCSEL is capable of emitting light in a path having a power output of at least 10 mW. The phase shift mask is integrated with the VCSEL and allows for a 180° shift in light emitted therethrough.

In addition, included is a method of fabricating a VCSEL for high density optical storage applications including providing a substrate element, disposing a first DBR mirror stack on the substrate element, disposing an active region on the first DBR mirror stack, disposing a second mirror stack on the active region, and disposing a one-half wavelength phase shift mask on the second DBR mirror stack. The phase shift mask is integrated with the VCSEL and allows for a 180° shift in light passing therethrough prior to focusing into a focal spot by an optical element. The shifting of light passing therethrough the phase shift mask creating a focal spot of reduced size with a large numerical aperture (NA) lens for high density data write applications.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE DRAWINGS

Figure 1:
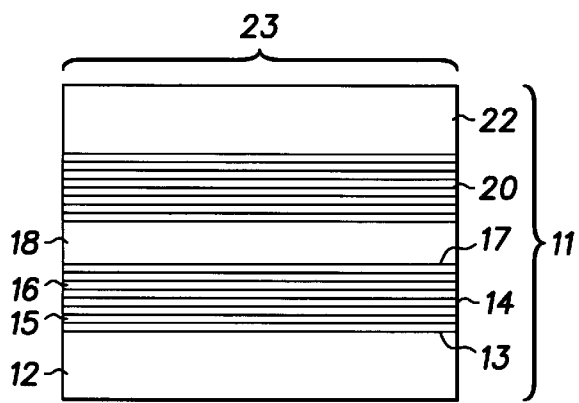
FIG. 1 is a schematic view of a VCSEL with integrated phase mask fabricated on a substrate element in accordance with the present invention.

Turning now to the drawings, attention is first directed to FIG. 1 which illustrates a vertical cavity surface emitting laser (VCSEL) with integrated phase mask, generally designated 10. A VCSEL 11 is formed on a substrate element 12, which in this specific embodiment is gallium arsenide (GaAs). GaAs is preferably used to facilitate lattice matching of the components of VCSEL 11 which emits light of a specific wavelength. It should be understood that GaAs is only utilized as an example and other semiconductor materials may be employed as substrate 12.

Substrate 12 has an upper surface 13 on which a mirror stack 14 is disposed. In this particular embodiment, mirror stack 14 includes a plurality of mirror pairs in an AlAs/$Al_{0.25}Ga_{0.75}As$ material system, more particularly illustrated are alternating layers of AlAs 15 and AlGaAs 16.

There is disposed on a surface 17 of a last alternating mirror pair of mirror stack 14, an active region 18 composed of an $Al_{0.12}Ga_{0.88}As/Al_{0.3}Ga_{0.7}As$ material system. Active region 18 includes an active structure (not shown) sandwiched between a first cladding region and a second cladding region (not shown).

Mirror stack 14 is formed by depositing pairs of layers on substrate 12 by some convenient technique such as molecular beam epitaxy (MBE), metal-organic chemical vapor deposition (MOCVD) or sputtering. Approximately 25–40 mirror pairs of this material system are deposited on substrate 12 depending on the difference between the refractive indices of the layers. This material system is capable of providing a difference in indices of refraction between layers 15 and 16 in a range of 0.3 to 0.5. This difference in refractive index is large enough to achieve sufficient reflectance of DBR mirror stack 14. It should be understood that these materials can be grown with excellent quality. Active region 18 includes cladding regions which include one or more layers which may be graded if necessary for better carrier confinement. In this specific embodiment the cladding regions are formed of an $Al_{0.5}Ga_{0.5}As/Al_{0.3}Ga_{0.7}As$ material system.

The active structure of active region 18 would include in this particular embodiment, a quantum well layer (not shown) sandwiched between a plurality of barrier layers. The total thickness of active region 18 being one wavelength of the emitted light or a multiple thereof. The quantum well layer is preferably formed of $Al_{0.12}Ga_{0.88}As$ and the barrier layers are preferably formed of $Al_{0.3}Ga_{0.7}As$. One skilled in the art will understand that more quantum well layers and barrier layers can be used depending upon the application. In this particular embodiment, active region 18 is configured to emit light with a wavelength in a range of approximately 780 nm. It should be understood that by altering the material systems described above, VCSEL 11 can be fabricated to emit other wavelengths of light. It should be understood that one such alteration of active region material systems includes active region 18 being formed of an AlGaInP/InGaP material system.

Next, top DBR mirror stack 20 is grown on a surface of active region 18. Mirror stack 20 is formed by depositing pairs of alternating layers on active region 18, using some convenient technique such as molecular beam epitaxy (MBE), metal-organic chemical vapor deposition (MOCVD), or sputtering. Top mirror stack 20 in this particular embodiment is fabricated from an AlAs/$Al_{0.25}Ga_{0.75}As$ material system and composed of approximately 20–30 mirror pairs. Once DBR mirror stack 20 is fabricated, a one-half wavelength thick silicon nitride (SiN) material, more particularly a one-half wavelength phase shift mask 22, is deposited on a last alternating mirror pair of mirror stack 20. Alternatively, phase shift mask 22 is composed of a one-half wavelength thick silicon dioxide ($SiO_2$) material, or a combination of a dielectric material, such as TiO, TaO, or the like, and an organic material, such as polyimide, or the like. Phase shift mask 22 is fabricated by depositing the SiN material layer by plasma enhanced chemical vapor deposition (PECVD) techniques, or other deposition methods. A dry or wet etch process is utilized to selectively remove a portion of the silicon nitride in the area of a laser emission aperture 23, defined by VCSEL 11, that does not need any phase shift. More particularly, a portion of phase shift mask 22 is removed so that there exist a one-half wavelength difference between the portion of the laser emission aperture 23 where phase mask 22 is not removed and the portion of the laser emission aperture 23 where phase shift mask 22 is removed. The cost of manufacture of VCSEL with integrated phase mask 10 is decreased by forming phase shift mask 22 directly on a surface of mirror stack 20, thus forming an integrated phase shift mask and VCSEL.

Figure 2:
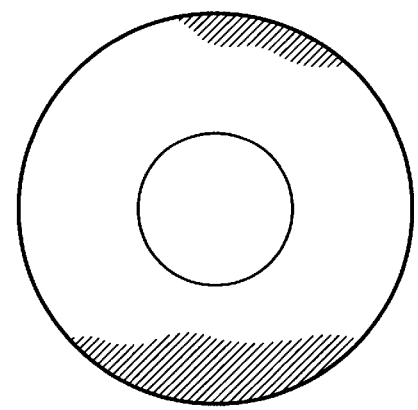
FIG. 2 is a schematic top view of a typical donut mode VCSEL aperture in accordance with the present invention.

VCSEL with integrated phase mask 10 is fabricated to emit a coherent first order mode light operating in a H01 or H10 (first order) mode, more particularly VCSEL 11 is fabricated as a donut mode VCSEL, the light emitted characterized as having two lobes and capable of undergoing a 180° phase shift. A simplified schematic top illustration of donut mode VCSEL emission aperture 23 is illustrated in FIG. 2. A fundamental mode high output power light source is typically required for proper operation during high density data write applications used in high density optical storage devices, but the first order or higher mode laser beam with appropriate phase shift can perform a similar or better writing function due to the existence of a writing threshold power, especially when a phase-changing material is used as the recording media. Typically 3–4 mW of power is required for read applications and at least 10 mW of power is required for data write applications. During operation in a data write mode, high power donut mode VCSEL 11 emits light having a specific focal point when passing through a high NA lens. In order to operate at optimal performance it is necessary to focus the output beam into a spot equal to or smaller than the Fourier transform limited spot size of a Gaussian mode, more particularly a spot size of less than 1 micron in diameter. To aid in this focusing of the output beam, VCSEL 11, as previously stated, includes an integrated phase shift mask fabricated as a part thereof (discussed presently).

Phase shift mask 22 is fabricated on a portion of laser aperture 23 so as to allow light emitted by VCSEL 11 to pass therethrough phase shift mask 22. As previously stated, phase shift mask 22 is generally composed of a silicon nitride (SiN) material capable of shifting the phase of light emitted therethrough approximately 180°. In general, phase shift mask 22 serves to correct the mode structure of the light emitted therethrough so as to focus it into a focal spot with a strong center lobe and two side lobes after a focal lens. During operation, either an electrical filter or an optical spatial filter can be utilized to further filter the two side lobes which are detrimental during data write applications, causing potential cross-talk and interfering noise.

Figure 3:
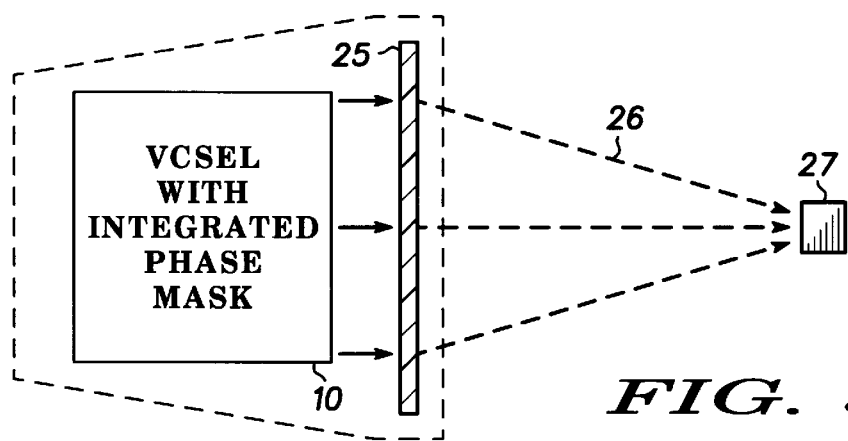
FIG. 3 is a schematic view showing an optical pickup head in accordance with the present invention.
Figure 4:
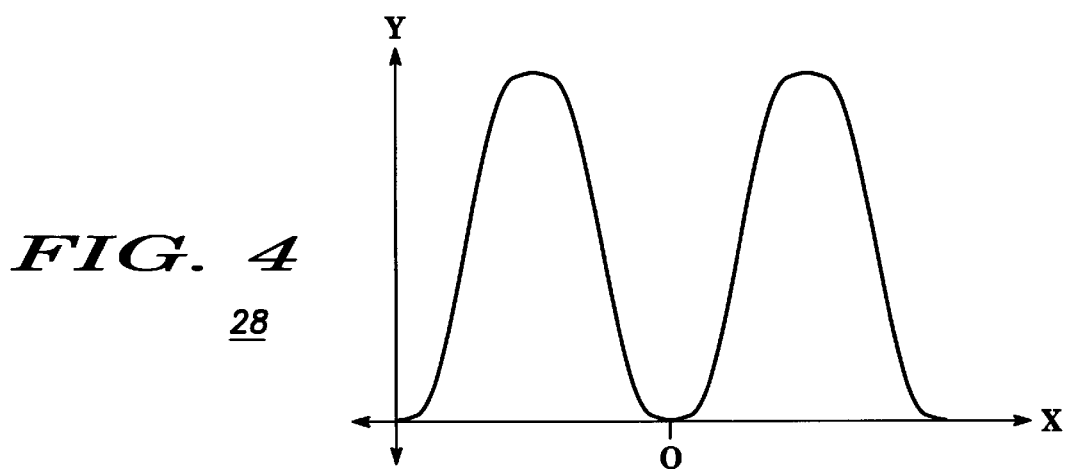
FIGS. 4 and 5 are graphical representations illustrating the intensity of light emitted by a donut mode VCSEL, prior to focusing, and subsequent to focusing without a phase shift mask in accordance with the present invention.
Figure 5:
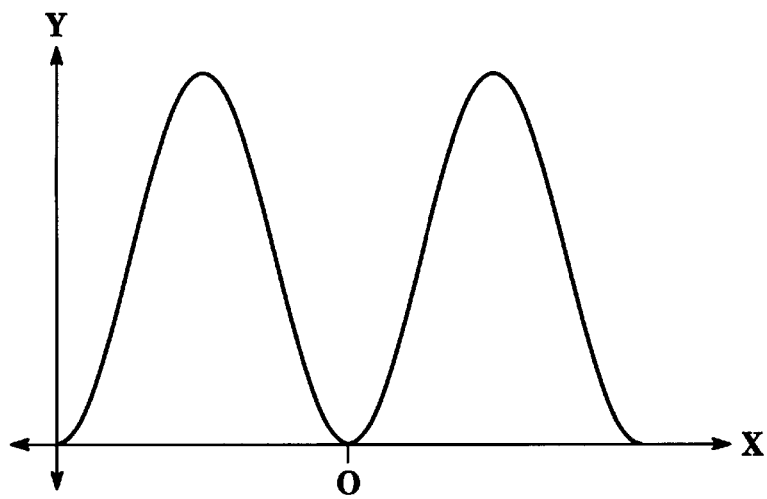

Referring now to FIG. 3, illustrated is a schematic sectional view of an optical pickup head in accordance with the present invention. An optical pickup head 24 in which the VCSEL with integrated phase shift mask 10 is utilized would have positioned on a side through which a laser emission 26 would pass, a lens element 25. Once laser emission 26 has undergone a shift in phase when passing through phase shift mask 22, it is focused by lens element 25 and light 26 is emitted therethrough having a focal spot 27 with a size smaller than the diffraction limited Gaussian mode. More particularly, the size of focal spot 27 is less than 1 micron in size for optimal performance of pickup head 24. Graphically represented in FIGS. 4 and 5 is the intensity of light emitted by a typical donut mode VCSEL, prior to focusing 28, and subsequent to focusing 29 without an integrated phase shift mask in accordance with the present invention.

Figure 6:
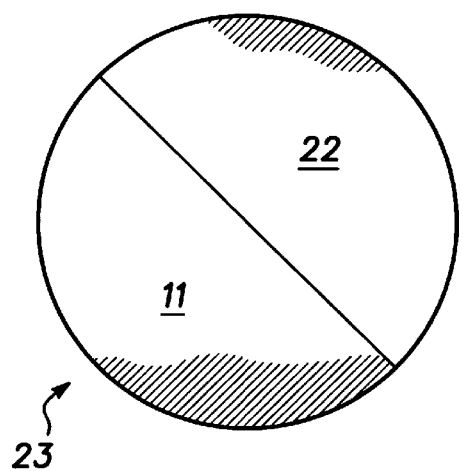
FIG. 6 is a schematic top view of a VCSEL aperture having an integrated phase shift mask over approximately one-half of the laser emission aperture in accordance with the present invention.

During operation VCSEL with integrated phase mask 10 is electrically controlled to activate a data read function or a data write function. During the data read function light would be emitted from VCSEL 11 operating at a low power level of about 1–3 mW. Referring to FIG. 6 illustrated is a simplified top view of laser emission aperture 23 of VCSEL with integrated phase shift mask 10 of the present invention. It should be understood that the silicon nitride phase shift mask 22 is formed over a portion of the VCSEL layers, generally noted as 11 in FIG. 1 and FIG. 6. During the data write function light would be emitted from VCSEL with a power level of approximately 15 mW.

Figure 7:
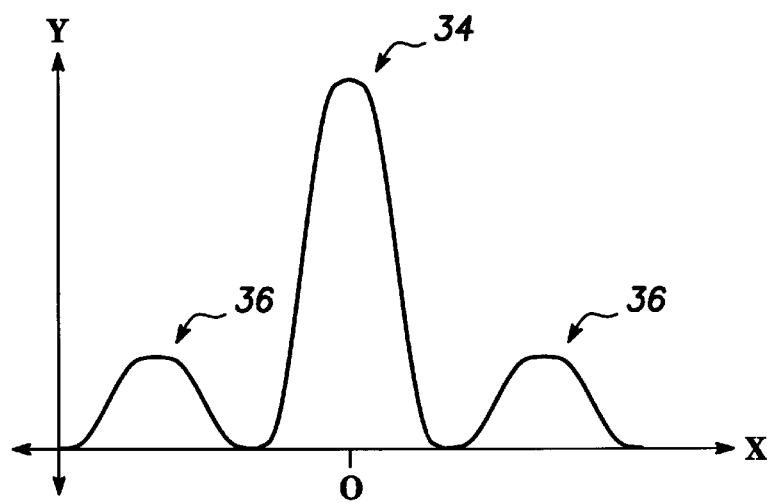
FIG. 7 is s graphical representation illustrating the intensity of light emitted by a donut mode VCSEL having passed through the integrated phase shift mask, prior to forming a focal spot in accordance with the present invention.

Referring now to FIG. 7, provided is a graphical representation illustrating the intensity of light emitted by VCSEL with integrated phase shift mask 10 in accordance with the present invention. More specifically, as illustrated in FIG. 7, light emitted by donut mode VCSEL 11 undergoes a shift in phase, thus a correction in mode structure, and is focused to provide for a large center lobe 34 and two small side lobes 36. Center lobe 34 is smaller than the focal spot of a Fourier-transform limited Gaussian beam. This allows for optimal performance of the optical pickup head in high density data write applications. As previously stated, side lobes 36 can be electrically or optically filtered to eliminate cross-talk and/or interference during a high density optical read or write mode.

Thus, disclosed is a donut mode vertical cavity surface emitting laser (VCSEL) with an integrated phase shift mask for use in an optical pickup head for high density storage, that can be utilized as a reading and writing head for both CD and DVD applications. The donut mode VCSEL with integrated phase shift mask is capable of operation in both data read and data write functions. The donut mode VCSEL with integrated phase shift mask in conjunction with an optical element, together are capable of focusing the output laser emission beam into a small focal spot for optimal performance in a high density data write mode. This allows for a decrease in the complexity of the design and cost of optical pickup heads, due to the decrease in complexity of the light source, and overcomes the challenges presented in achieving quality high density data read and write results using a VCSEL light source.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser comprising:
   a substrate element having a surface;
   a first DBR mirror stack disposed on the surface of the substrate element;
   an active region disposed on a surface of the first DBR mirror stack;
   a second DBR mirror stack disposed on a surface of the active region, the first DBR mirror stack, the active region and the second DBR mirror stack forming a vertical cavity surface emitting laser generating a laser emission along a path; and
   a phase shift mask disposed on a portion of an uppermost surface of the second DBR mirror stack, the phase shift mask for shifting the phase of the laser emission passing therethrough one-half wavelength.

2. A vertical cavity surface emitting laser as claimed in claim 1 wherein the substrate element is formed of gallium arsenide (GaAs).

3. A vertical cavity surface emitting laser as claimed in claim 2 wherein the first DBR mirror stack and the second DBR mirror stack are formed of alternating layers in an AlAs/AlGaAs material system.

4. A vertical cavity surface emitting laser as claimed in claim 3 wherein the active region is formed of an AlGaAs material system.

5. A vertical cavity surface emitting laser as claimed in claim 3 wherein the active region is formed of an AlGaInP/InGaP material system.

6. A vertical cavity surface emitting laser as claimed in claim 3 wherein the phase shift mask is formed on one-half of a laser emission aperture formed by the vertical cavity surface emitting laser.

7. A vertical cavity surface emitting laser as claimed in claim 6 wherein the phase shift mask is formed of a silicon nitride (SiN) material.

8. A vertical cavity surface emitting laser as claimed in claim 6 wherein the phase shift mask is formed of a silicon dioxide ($SiO_2$) material.

9. A vertical cavity surface emitting laser as claimed in claim 6 wherein the phase shift mask is formed of a combination of a dielectric material and an organic material.

10. A vertical cavity surface emitting laser comprising:
    a substrate element having a surface;
    a first DBR mirror stack disposed on the surface of the substrate element:
    an active region disposed on a surface of the first DBR mirror stack;
    a second DBR mirror stack disposed on a surface of the active region, the first DBR mirror stack, the active region and the second DBR mirror stack forming a vertical cavity surface emitting laser generating a laser emission along a path; and one of an integrated silicon nitride (SiN) phase shift mask, an integrated combination dielectric and organic phase shift mask and an integrated silicon dioxide (SiO2) phase shift mask disposed on a portion of an uppermost surface of the second DBR mirror stack, the one of an integrated silicon nitride (SiN) phase shift mask, an integrated combination dielectric and organic phase shift mask, and an integrated silicon dioxide (SiO2) phase shift mask for shifting the phase of the laser emission passing therethrough by one-half wavelength.

11. A vertical cavity surface emitting laser as claimed in claim 10 wherein the substrate element is formed of gallium arsenide (GaAs).

12. A vertical cavity surface emitting laser as claimed in claim 11 wherein the first DBR mirror stack and the second DBR mirror stack are formed of alternating layers in an AlAs/AlGaAs material system.

13. A vertical cavity surface emitting laser as claimed in claim 12 wherein the active region is formed of an AlGaAs material system.

14. A vertical cavity surface emitting laser as claimed in claim 12 wherein the active region is formed of an AlGaInP/InGaP material system.

15. A vertical cavity surface emitting laser as claimed in claim 12 wherein the one of an integrated silicon nitride (SiN) phase shift mask, an integrated combination dielectric and organic phase shift mask, and an integrated silicon dioxide (SiO$_2$) phase shift mask is formed on one-half of a laser emission aperture formed by the vertical cavity surface emitting laser.

16. An optical pickup head comprising:
   a multi-mode vertical cavity surface emitting laser emitting light of a specific phase along a path; including a substrate element, a first DBR mirror stack disposed on a surface of the substrate element, an active region disposed on a final layer of the first DBR mirror stack, and a second DBR mirror stack disposed on a surface of the active region;
   an integrated phase shift mask fabricated on an uppermost surface of the second DBR mirror stack and over a portion of the multi-mode vertical cavity surface emitting laser in a path of the emitted light, thereby changing the phase of the light passing therethrough one-half wavelength; and
   an optical element positioned in a path of the light passing therethrough the integrated phase shift mask, the optical element focusing the emitted light into a small focal spot.

17. An optical pickup head as claimed in claim 16 wherein the one-half wavelength integrated phase shift mask includes a silicon nitride (SiN) material.

18. An optical pickup head as claimed in claim 16 wherein the one-half wavelength integrated phase shift mask includes a silicon dioxide (SiO$_2$) material.

19. An optical pickup head as claimed in claim 16 wherein the one-half wavelength integrated phase shift mask includes a combination of a dielectric material and an organic material.

20. An optical pickup head as claimed in claim 16 wherein the small focal spot is less than 1 micron in diameter.

21. An optical pickup head as claimed in claim 16 wherein the small focal spot is smaller than a Fourier transform limited spot size of a Gaussian mode.

22. A method of fabricating a vertical cavity surface emitting laser comprising the steps of:
   providing a substrate element having a surface;
   disposing a first DBR mirror stack on the surface of the substrate element;
   disposing an active region on a surface of the first DBR mirror stack;
   disposing a second DBR mirror stack on a surface of the active region; and
   disposing a one-half wavelength phase shift mask on an uppermost surface of the second DBR mirror stack.

23. A method of fabricating a vertical cavity surface emitting laser as claimed in claim 22 wherein the step of disposing a one-half wavelength phase shift mask on the second DBR mirror stack includes disposing one of a silicon nitride (SiN) material, a combination of a dielectric material and an organic material, and a silicon dioxide (SiO$_2$) material on the surface of the second DBR mirror stack and selectively removing a portion of the one of a silicon nitride material, a combination of a dielectric material and an organic material, and a silicon dioxide (SiO$_2$) material, thereby forming an integrated phase shift mask on a portion of a laser emission aperture defined by the vertical cavity surface emitting laser.

* * * * *